United States Patent
Zortea

(10) Patent No.: US 8,779,952 B1
(45) Date of Patent: Jul. 15, 2014

(54) BACKGROUND CALIBRATION OF THRESHOLD ERRORS IN ANALOG TO DIGITAL CONVERTERS

(71) Applicant: PMC-Sierra US, Inc., Sunnyvale, CA (US)

(72) Inventor: Anthony Eugene Zortea, Pipersville, PA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/766,855

(22) Filed: Feb. 14, 2013

Related U.S. Application Data

(60) Provisional application No. 61/623,411, filed on Apr. 12, 2012.

(51) Int. Cl.
  *H03M 1/06* (2006.01)
  *H03M 1/08* (2006.01)
(52) U.S. Cl.
  CPC .......... *H03M 1/0607* (2013.01); *H03M 1/0854* (2013.01)
  USPC .......................................... 341/118; 341/120
(58) Field of Classification Search
  CPC .............. H03M 1/06–1/10607; H03M 1/0809; H03M 1/0836
  USPC .......................................... 341/118, 120, 155
  See application file for complete search history.

(56) References Cited

U.S. PATENT DOCUMENTS

| | | | |
|---|---|---|---|
| 4,380,005 A * | 4/1983 | Debord et al. ................. | 341/118 |
| 6,900,750 B1 * | 5/2005 | Nairn ............................ | 341/118 |
| 6,970,528 B2 | 11/2005 | Pearson | |
| 7,064,693 B1 * | 6/2006 | Huang et al. .................. | 341/120 |
| 7,161,523 B1 | 1/2007 | Zortea | |
| 7,253,762 B2 | 8/2007 | Huang et al. | |
| 7,271,757 B2 | 9/2007 | Nakamoto et al. | |
| 7,394,413 B2 | 7/2008 | Batruni | |
| 7,622,987 B1 * | 11/2009 | Zortea ............................. | 330/9 |
| 7,623,050 B2 * | 11/2009 | Le et al. ........................ | 341/118 |
| 7,741,982 B2 | 6/2010 | Johansson et al. | |
| 7,839,313 B2 | 11/2010 | Kidambi | |
| 8,115,662 B2 | 2/2012 | Anthony | |
| 8,611,473 B1 | 12/2013 | Warner | |
| 2008/0211702 A1 * | 9/2008 | Iorgulescu .................... | 341/118 |
| 2010/0117876 A1 * | 5/2010 | Cao et al. ...................... | 341/118 |

OTHER PUBLICATIONS

P. Nuzzo et al., Efficient Calibration through Statistical Behavioral Modeling of a High-Speed Low-Power ADC, 2006, IEEE, Research in Microelectronics and Electronics 2006, PhD, pp. 297-300, Print ISBN:1-4244-0157-7, INSPEC Accession No. 9145412.*

(Continued)

*Primary Examiner* — Howard Williams
(74) *Attorney, Agent, or Firm* — Dennis R. Haszko

(57) ABSTRACT

A method of background calibration of threshold errors in a data communication system is provided. In an implementation, the method uses sampler statistics just after foreground calibration as the reference signal in a control loop method to remove individual sampler offsets. In an implementation in which an analog to digital converter (ADC) includes a plurality of sub-ADCs, gain, offset, and individual threshold errors across parallel, time-interleaved sub-ADCs are minimized by establishing individual comparator statistics for the average sub-ADC after an initial foreground calibration, then forcing each individual comparator to maintain its statistics over time, in the background, by continuously adjusting its threshold.

31 Claims, 5 Drawing Sheets

(56) References Cited

OTHER PUBLICATIONS

Agazzi et al., "Background Calibration of Interleaved Analog to Digital Converters for High-Speed communications Using Interleaved Timing Recovery Techniques", Circuits and Systems, ISCAS, IEEE International Symposium on Circuits and Systems, May 23-25, 2005, vol. 2, pp. 1390-1393, Irvine, California, USA.

Agazzai et al., "Background Calibration of Interleaved Analog to Digital Converters for High-Speed communications Using Interleaved Timing Recovery Techniques", Circuits and Systems, ISCAS, IEEE International Symposium on Circuits and Systems, May 23-25, 2005, vol. 2, pp. 1390-1393, Irvine, California, USA.

Huang et al., "A Statistical Background Calibration Technique for Flash Analog-to-Digital Converters", Circuits and Systems, ISCAS, IEEE International Symposium on Circuits and Systems, May 23-26, 2004, vol. 1, pp. I-125 to I-128, Hsin-Chu, Taiwan.

Tsimbinos et al., "Improved error-table compensation of A/D converters" IEE Proc.-Circuits Devices Syst., vol. 144, No. 6, Dec. 1997.

Nikaeen, P. et al., Digital Compensation of Dynamic Acquisition Errors at the Front-End of High-Performance A/D Converters, IEEE Journal of Selected Topics in Signal Processing, vol. 3, No. 3, Jun. 2009, pp. 499-508.

\* cited by examiner

BACKGROUND CALIBRATION OF THRESHOLD ERRORS IN ANALOG TO DIGITAL CONVERTERS

CROSS-REFERENCE TO RELATED APPLICATIONS

The present application claims priority from U.S. Provisional Patent Application Ser. No. 61/623,411 filed on Apr. 12, 2012, and is also related to commonly assigned U.S. patent application Ser. No. 13/766,948 entitled "Background Calibration of Aperture Center Errors in Analog to Digital Converters", filed on Feb. 14, 2013, both of which are incorporated herein by reference in their entirety.

FIELD

The present disclosure relates generally to analog to digital converters (ADCs) that are used in data communications, for example serializer/deserializer (SerDes) and optical transceivers. More particularly, the present disclosure relates to threshold error calibration in such data communications.

BACKGROUND

A flash ADC comprises a set of comparators, each with a different threshold. The input to a comparator could be between 0 and 1 volt. If a signal comes in at 0.5 volts, the comparators that have a threshold of 0.5 volts or lower provide an output of 1, while the comparators having a threshold above 0.5 volts provide an output of 0. As such, the comparators provide an indication, based on their thresholds, of the input signal value.

For ADC comparators, the thresholds are normally linearly spaced with respect to each other, although this constraint is not necessary. An important constraint is that the thresholds be known to the downstream digital signal processor (DSP). For a bank of comparators arranged such that they are evenly and linearly spaced, such that the threshold voltage between any two thresholds is the same, the quality of the data conversion depends on the linearity of that spacing. An example implementation with 16 threshold levels would provide a data convertor of 4 bits (since $2^4=16$). This would require 16 evenly spaced thresholds. If the thresholds are not evenly spaced, the effective resolution of ADC is lower than 16.

In order to obtain a better quality of ADC, it is important that the thresholds be spaced as linearly as possible. However, each one of those comparators is an imperfect analog circuit and it performs the comparison at a rising edge of the clock. Therefore, at the clock edge, it compares the input to the threshold, and if the input is above the threshold then the output is a 1, and if it is below the threshold the output is a 0.

Flash ADC comparators are analog circuits whose ideal input-output relationship can be described as:

$$\text{output}_k(t)=\text{sign}(\text{input}(t)-\text{threshold}_k) \quad \text{Equation 1}$$

However the real-life, or non-ideal, behavior of the comparator introduces an offset, thereby shifting the kth threshold by an amount $\text{offset}_k$, as shown below.

$$\text{output}_k(t)=\text{sign}(\text{input}(t)-\text{threshold}_k+\text{offset}_k) \quad \text{Equation 2}$$

It is desirable to remove, or "calibrate out" these offsets so that the thresholds can be known to the DSP.

There are two categories of calibration: foreground and background. Foreground calibration refers to a procedure performed in such a way as to disrupt the normal signal flow through the ADC, often by temporarily removing the normal ADC input signal and introducing a known calibration input signal. By doing so, during foreground calibration the system in which the ADC is performing the data conversion is not able to process the normal input signal. This disruption can sometimes be tolerated at certain times in the life cycle of the system with the ADC, perhaps for a brief time at power up.

Background calibration refers to a calibration procedure in which the normal signal flow of the system with the ADC is not disrupted in any way; the system can continue to process data from the ADC and expect the conversion performance to be within specified bounds and that the normal input signal is being converted.

Recall the input-output relationship of an analog comparator:

$$\text{output}_k(t)=\text{sign}(\text{input}(t)-\text{threshold}_k+\text{offset}_k) \quad \text{Equation 3}$$

Where "k" is an index referring to the "kth" comparator. Thus, the "effective" threshold is at $\text{threshold}_k-\text{offset}_k$. For example, if a threshold of 0.1 is desired and there is an offset of 0.01, then the effective threshold is 0.11. Foreground calibration works by introducing a known input signal (usually equal to the desired threshold) and adjusting the threshold so that the offset is effectively removed. For convenience, assume that the foreground calibration occurs at t=0.

$$\text{output}_k(0)=\text{sign}(\text{threshold}_k-(\text{threshold}_k+\text{offset}_k)+\text{offset}_k)=\text{sign}(0) \quad \text{Equation 4}$$

Here, "sign(0)" is shown as the comparator calibrated state since at this value, the comparator is exactly between a +1 and −1 output, so any arbitrarily small change in the input will force the comparator to be resolved.

In this manner, the offset of the comparator is removed by adding it to the desired ideal threshold of the comparator. So, set $$\text{threshold}_k=\text{DesiredThreshold}_k+\text{offset}_k \quad \text{Equation 5}$$

There is still one important non-ideality missing from Equation 3, the variation in time of the offset, shown below in Equation 4.

$$\text{output}_k(t)=\text{sign}(\text{input}(t)-\text{threshold}_k(t)+\text{offset}_k(t)) \quad \text{Equation 6}$$

Foreground calibration can calibrate the threshold at a given point in time, but if the $\text{offset}_k$ varies significantly with time, ADC performance will be degraded. In this case, background calibration is necessary, and so the following is needed:

$$\text{threshold}_k(t)=\text{DesiredThreshold}_k+\text{offset}_k(t) \quad \text{Equation 7}$$

It is, therefore, desirable to adjust $\text{threshold}_k(t)$ in the background.

BRIEF DESCRIPTION OF THE DRAWINGS

Embodiments of the present disclosure will now be described, by way of example only, with reference to the attached Figures.

DETAILED DESCRIPTION

Figure 1:
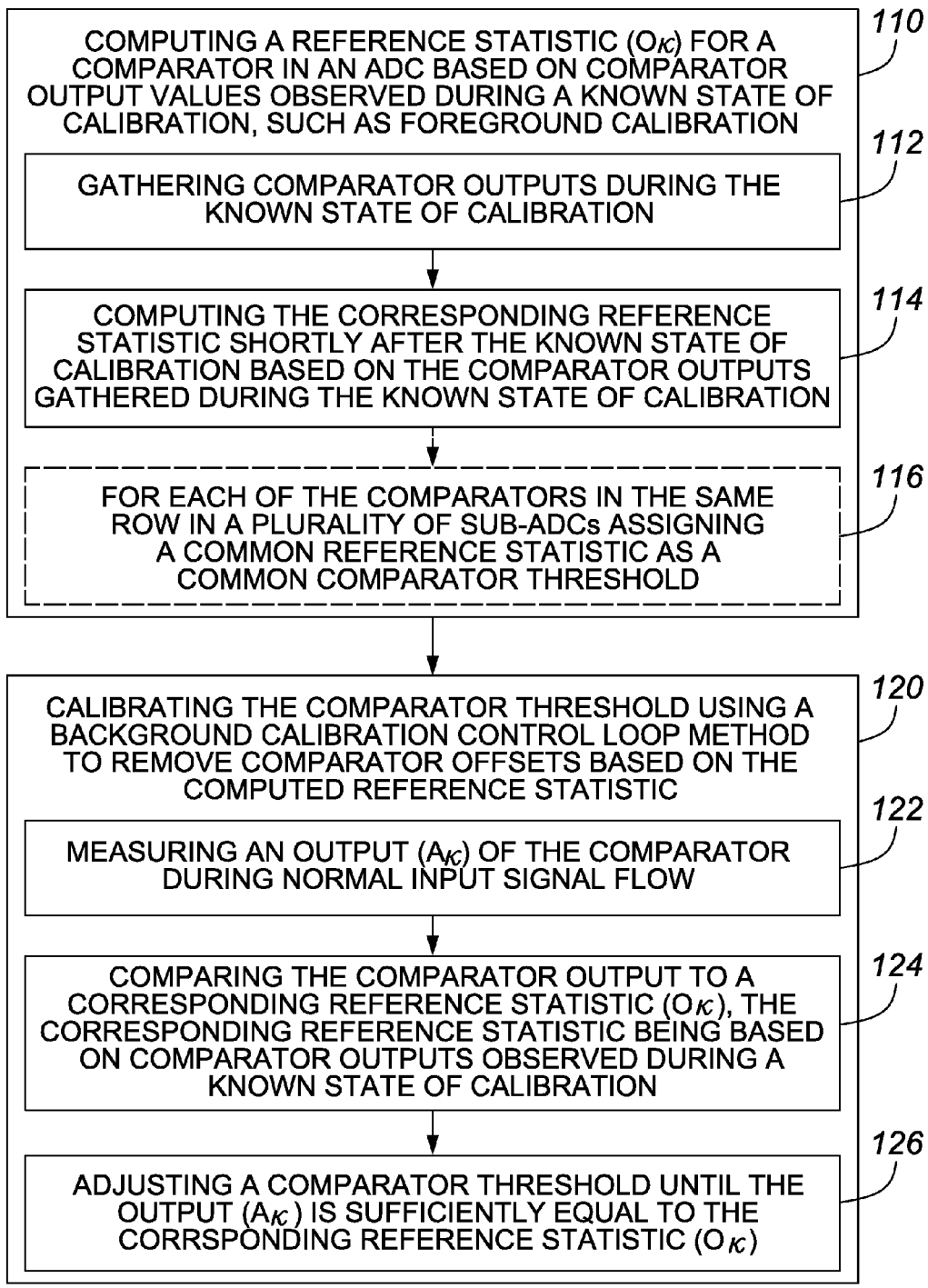
FIG. 1 illustrates a method of background calibration of threshold errors in ADCs according to an embodiment of the present disclosure.

Generally, the present disclosure provides a method of background calibration of threshold errors in a data communication system. In an implementation, the method uses sampler statistics just after foreground calibration as the reference signal in a control loop method to remove individual sampler offsets. In some cases, very high speed flash ADCs often employ "time-interleaving" in which a total flash ADC is comprised of several time-interleaved sub-ADCs clocked at a slower rate. In an implementation in which an ADC includes a plurality of sub-ADCs, gain, offset, and individual threshold errors across parallel, time-interleaved sub-ADCs are minimized by establishing individual comparator statistics for the average sub-ADC after an initial foreground calibration, then forcing each individual comparator to maintain its statistics over time, in the background, by continuously adjusting its threshold. Embodiments of the present disclosure are implemented in time-interleaved ADCs, and in other implementations.

In an embodiment, the present disclosure provides a method of background calibration of threshold errors in an ADC having a plurality of comparators comprising: for each of the plurality of comparators: measuring an output ($A_k$) of the comparator with index "k" during normal input signal flow; comparing the comparator output to a corresponding reference statistic ($O_k$), the corresponding reference statistic being based on comparator outputs observed during a known state of calibration; and adjusting a comparator threshold until the output ($A_k$) is sufficiently equal to the corresponding reference statistic ($O_k$).

In an example embodiment, the corresponding reference statistic is based on comparator outputs observed: when the ADC is in a normal operation state, but just after the ADC has been calibrated; during power-up; or during foreground calibration.

In an example embodiment, the method further comprises: computing the corresponding reference statistic shortly after the known state of calibration based on the comparator outputs gathered just after the known state of calibration.

In an example embodiment, the method further comprises: gathering comparator outputs during the known state of calibration.

In an example embodiment, the method further comprises, prior to the comparing: calibrating a comparator threshold in the foreground using an on-chip calibration signal.

In an example embodiment, the measuring, the comparing and the adjusting are performed such that input and output signal flow to and from the ADC are undisturbed.

In an example embodiment, wherein the ADC comprises a plurality of sub-ADCs arranged logically in columns, the plurality of sub-ADCs each having comparators arranged logically in rows, the method further comprises: assigning a common reference statistic as a common comparator threshold for each of the comparators in the same row in the plurality of sub-ADCs. In an example embodiment, the method further comprises: computing an average reference statistic for each of the comparators in the same row in the plurality of sub-ADCs; and assigning the average reference statistic as the common reference statistic.

In another embodiment, the present disclosure provides a method of background calibration of threshold errors in a data communication system, comprising: computing a reference statistic for a comparator in an ADC based on comparator output values observed during foreground calibration; and calibrating the comparator threshold using a background calibration control loop method to remove comparator offsets based on the computed reference statistic.

In an example embodiment, the method further comprises: measuring an output ($A_k$) of the comparator during normal input signal flow; comparing the comparator output to the computed reference statistic ($O_k$); and adjusting the comparator threshold until the output ($A_k$) is sufficiently equal to the corresponding reference statistic ($O_k$).

In an example embodiment, computing the reference statistic is performed shortly after a transition from foreground calibration to background calibration.

In an example embodiment, wherein the ADC comprises a plurality of sub-ADCs arranged in columns, the plurality of sub-ADCs each having comparators arranged in rows, the method further comprises: assigning a common reference statistic as a common comparator threshold for each of the comparators in the same row in the plurality of sub-ADCs. In an example embodiment, the method further comprises: computing an average reference statistic for each of the comparators in the same row in the plurality of sub-ADCs; and assigning the average reference statistic as the common reference statistic.

In another embodiment, the present disclosure provides a computer-readable memory device storing statements and instructions for execution by a processor to perform a method of background calibration of threshold errors in an analog to digital converter ADC having a plurality of comparators, as described and illustrated herein.

In an embodiment, the present disclosure provides a method of background calibration of threshold errors in a data communication system, including using sampler statistics just after foreground calibration as the reference signal in a control loop algorithm to remove individual sampler offsets.

Other aspects and features of the present disclosure will become apparent to those ordinarily skilled in the art upon review of the following description of specific embodiments in conjunction with the accompanying figures.

Consider the example of a chip in a real time system that is used for a video streaming application. When an offset keeps changing over time due to environmental variables, such as temperature, there is a need to continuously account for this offset. Without background calibration, the chip processing would need to be stopped every few minutes so that the offset which varies with temperature can be corrected. Such disruptions in video streaming would not be acceptable.

During any calibration, a reference is required against which an error is measured, such that the system can be pushed in a direction that minimizes the error. While this general approach is common to control loop systems, a challenge in performing background calibration for an ADC is how to identify a proper reference; since the ADC is already a measurement, a measurer cannot be used to measure.

As part of calibration of threshold errors in a data communication system, comparison is made at the rising clock edge. Comparators need to have linearly spaced thresholds, but since they are analog circuits, there is an unknown (or changing over time) offset in reality, as described above. While there are existing methods for removing the offset, the offset can change over time due to environmental variables. It is therefore desirable to continuously account for the changing offset by performing the calibration in the background such that the calibration does not disrupt the normal signal flow of the system with the ADC.

Embodiments of the present disclosure take advantage of the fact that the ADC, at some point, such as at power-up, is known to be calibrated by some other method, for example in the foreground. Those previous calibration thresholds are known to be correct based on an existing technique. In the present disclosure, "O" is the reference when the ADC was known to be calibrated.

According to an embodiment of the present disclosure, statistics about outputs of the comparators are measured while running in normal mode. For example, in one second, observe the number of times a particular comparator is high and low, which will be described in relation to FIG. 2. As will be described in detail in relation to FIG. 3, the same observation is made during operation, with "A" referencing values measured during operation. In an embodiment of the present disclosure, such an approach is implemented for non-time-interleaved ADCs. In another embodiment of the present disclosure, such an approach is implemented for time-interleaved ADCs.

FIG. 1 illustrates a method of background calibration of threshold errors in ADCs according to an embodiment of the present disclosure. The method comprises: computing a reference statistic for a comparator in an ADC based on comparator output values observed during foreground calibration (110); and calibrating the comparator threshold using a background calibration control loop method to remove comparator offsets based on the computed reference statistic (120).

As shown in FIG. 1, in an example embodiment the method comprises one or both of: gathering comparator outputs during the known state of calibration (112); and computing the corresponding reference statistic shortly after the known state of calibration based on the comparator outputs gathered during the known state of calibration (114).

In another example embodiment, to be described later in further detail, when the ADC comprises a plurality of sub-ADCs with comparators arranged in rows, the method further comprises assigning a common reference statistic as a common comparator threshold for each of the comparators in the same row in the plurality of sub-ADCs (116).

In an example embodiment, the method comprises: measuring an output ($A_k$) of the comparator during normal input signal flow (122); comparing the comparator output to a corresponding reference statistic ($O_k$), the corresponding reference statistic being based on comparator outputs observed during a known state of calibration (124); and adjusting a comparator threshold until the output ($A_k$) is sufficiently equal to the corresponding reference statistic ($O_k$) (126). In an example embodiment, the corresponding reference statistic is based on comparator outputs observed when the ADC is in normal operation, but just after it has been calibrated (for example, using foreground calibration) and before it has time to drift. In an implementation in which the ADC is being foreground calibrated, it usually has a special input signal, different from the normal input signal.

In an embodiment, the method includes general steps 110 and 120, and optionally one or more of the related sub-steps.

In another embodiment, the method includes the sub-steps 122, 124 and 126, and optionally one or more of the steps 110, 112 or 114.

A method according to another example embodiment of the present disclosure will now be described for background calibration of comparator offset errors in a flash ADC. Some steps or actions in the method are enumerated below as items 1-4.

Step 1. Calibrate the thresholds in the foreground using on-chip calibration signal. See equations 3-5 for a description of foreground calibration.

For foreground calibration, which is generally known to one of ordinary skill in the art, first, the calibration input signal is multiplexed to the ADC input. One comparator at a time, the calibration input is set to the comparator's desired threshold. The actual comparator threshold is adjusted until its comparator output $A_k$, has a sufficiently equal number of 1s and 0s.

Step 2. Next, allow the normal input signal to flow to the ADC and process the output to the system as normal.

Step 3. Gather reference statistics for each comparator.

If each comparator with index "k" output is defined as $$A_k = \begin{matrix} 0, \text{ input} < thr_k \\ 1, \text{ input} > thr_k \end{matrix} \qquad \text{Equation 8}$$

Define a new value, $O_k$, $$O_k = \sum_N A_k \qquad \text{Equation 9}$$

where N is the number of samples of the comparator output.

Just after foreground calibration, before the comparator offsets are able to drift, the normal input signal is multiplexed to the ADC for normal operation and all $O_k$ are measured and stored. The $O_k$ will serve as the reference statistics for the comparators.

Figure 2:
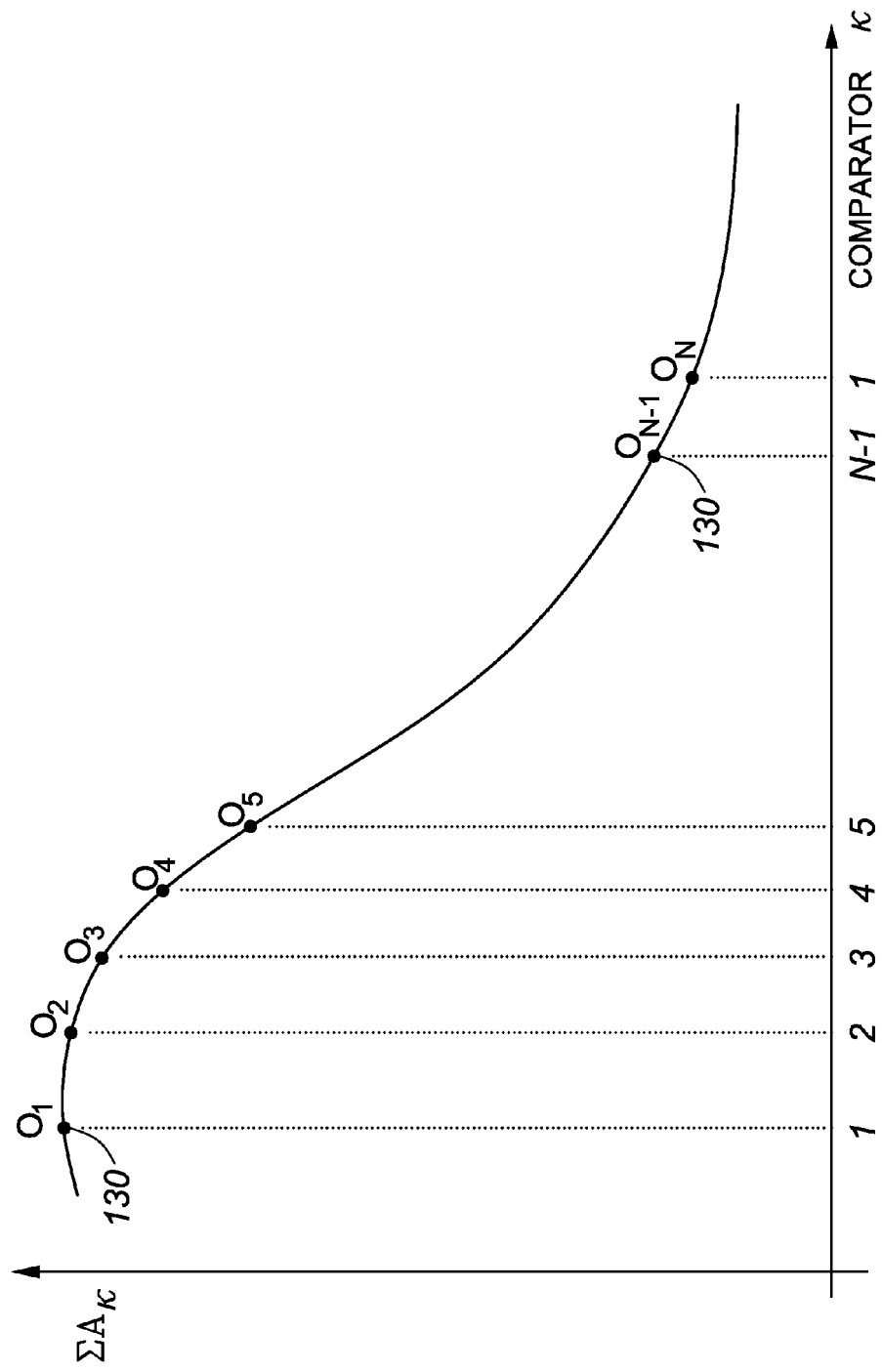
FIG. 2 illustrates reference statistics for comparators in background calibration mode according to an embodiment of the present disclosure.

A typical plot of the $O_k$ is shown in FIG. 2, which illustrates reference statistics for comparators in background calibration mode.

Step 4. Thereafter, measure the $A_k$ of each comparator, and compare to the reference stats $O_k$, and adjust the threshold until $A_k$ is sufficiently equal to $O_k$.

Figure 3:
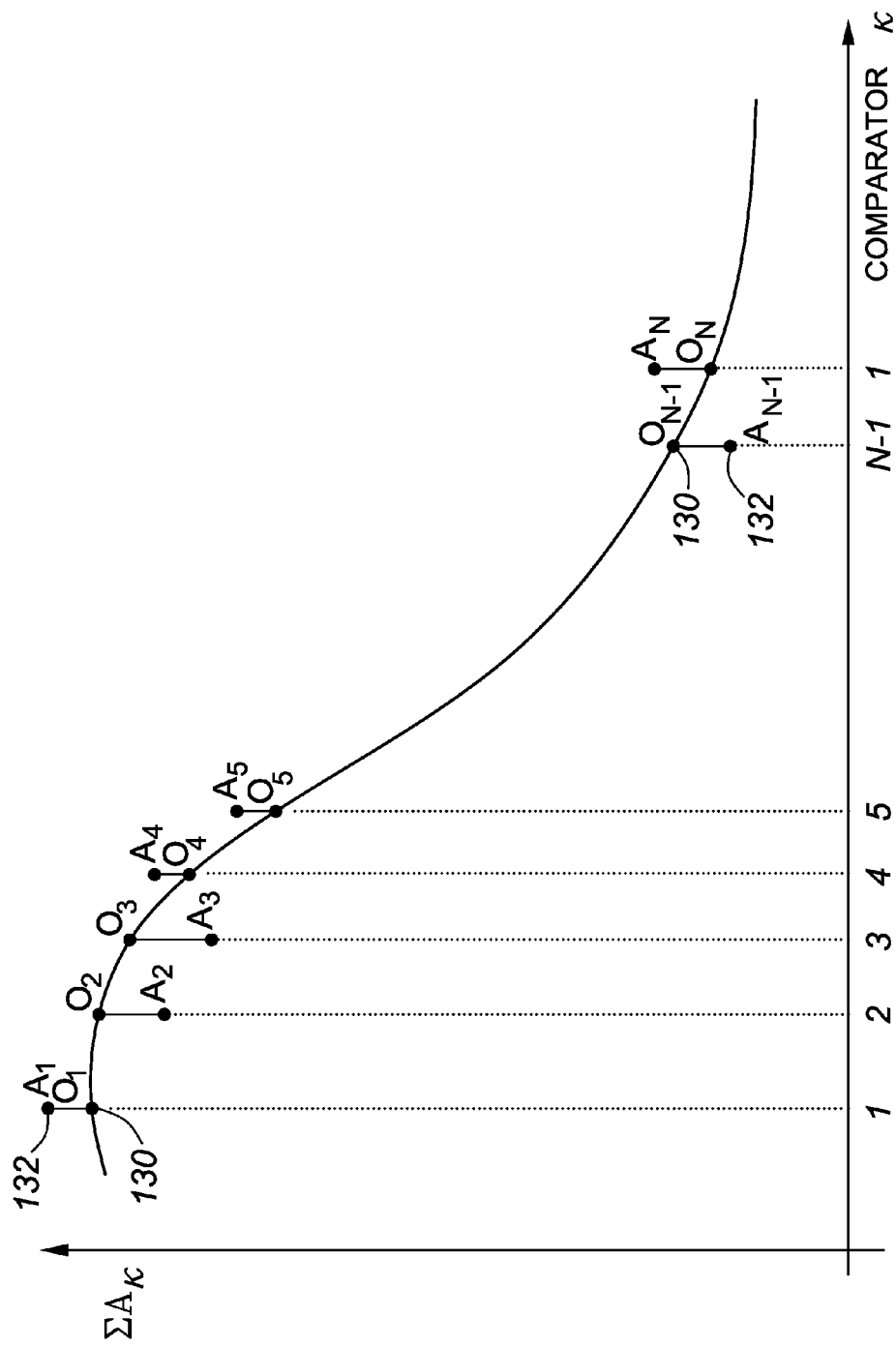
FIG. 3 illustrates reference statistics and measured Ak according to an embodiment of the present disclosure.

FIG. 3 illustrates reference statistics and measured $A_k$. Each "bar" between values $A_k$ and $O_k$ shown above each other on the plot is an error that is to be corrected by the background calibration.

The actual threshold of the comparator is then adjusted according to:

$$\text{If } |A_k - O_k| > \delta \xrightarrow{then} \text{threshold}_k[i+1] = \qquad \text{Equation 10}$$
$$\text{threshold}_k[i] - \mu \cdot \text{sign}(A_k - O_k)$$

In an example embodiment, the output of each individual comparator is measured and the number of times the output is high versus low is recorded. In FIG. 2, the x axis is the set of comparators and the y axis is the sum of the number of "1"s. Once the number of "1"s is known, then the number of "0"s can also be determined. A typical curve is ascertained and that provides a reference. Therefore, for a certain type of signal, a statistical determination can be made with respect to what the outputs of the comparators should be.

In an example embodiment, this determination is done by observation and the output can be observed without being disturbed, since it is a digital output at that point. Therefore, the signals are counted, one at a time, as shown in FIG. 3. The same observation is then made again.

Consider the following example in which a new measurement is made on comparator 5, say A5, occurring on O5. Suppose at power up for comparator 5, for a time window of 1 sec, there should be on average 100 "1"s or close to 100 "1"s. If the next time the measurement is taken, there are 200 "1"s, then it can be ascertained that the threshold must be too low and needs to be pushed up in order to get around 100 "1"s.

In an example embodiment, all pairs are examined, with $A_k$, the measured output for comparator K, being compared to $O_k$. If the difference is greater than a specified delta, then the threshold is adjusted as shown in Equation 10. So threshold at time 1+1 is equal to threshold at time i plus some small factor of µ plus the sign of the difference. The sign of the difference provides the direction of the error—whether positive or negative direction.

The difference between the A and the O output is that O is the reference that was measured in FIG. 2, which establishes the reference by observation. These are the measured number of "1"s in a given time period when the ADC was known to be calibrated. A is the number of "1"s, when the ADC is no longer calibrated. However, O and A are both measured in the same way. Therefore, O value is taken during power up or when ADC is known to be calibrated and A is measured any time after that in actual operation.

Figure 4A:
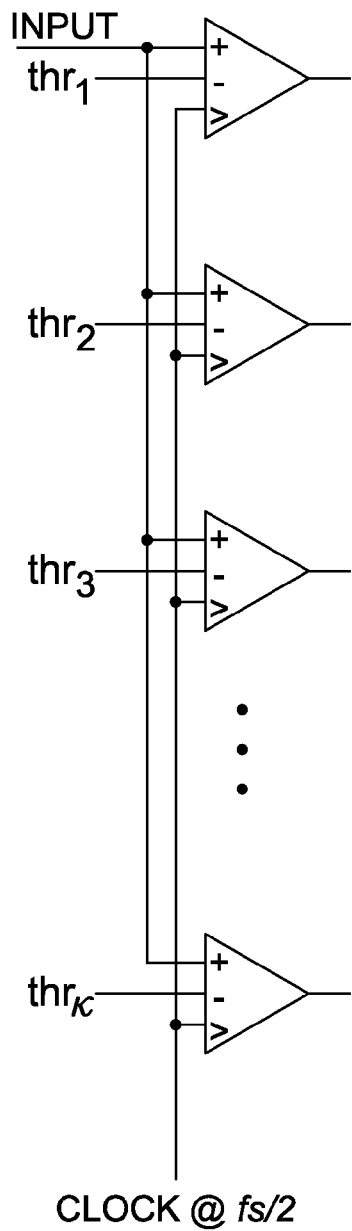
FIGS. 4A and 4B illustrate example comparator arrangements in non-time-interleaved and time-interleaved flash ADCs, respectively.

The method in the example embodiments above describe the case when the flash ADC is a single set of comparators which all sample the input signal at the same instant. Such an ADC implementation is shown in FIG. 4A.

Figure 4B:
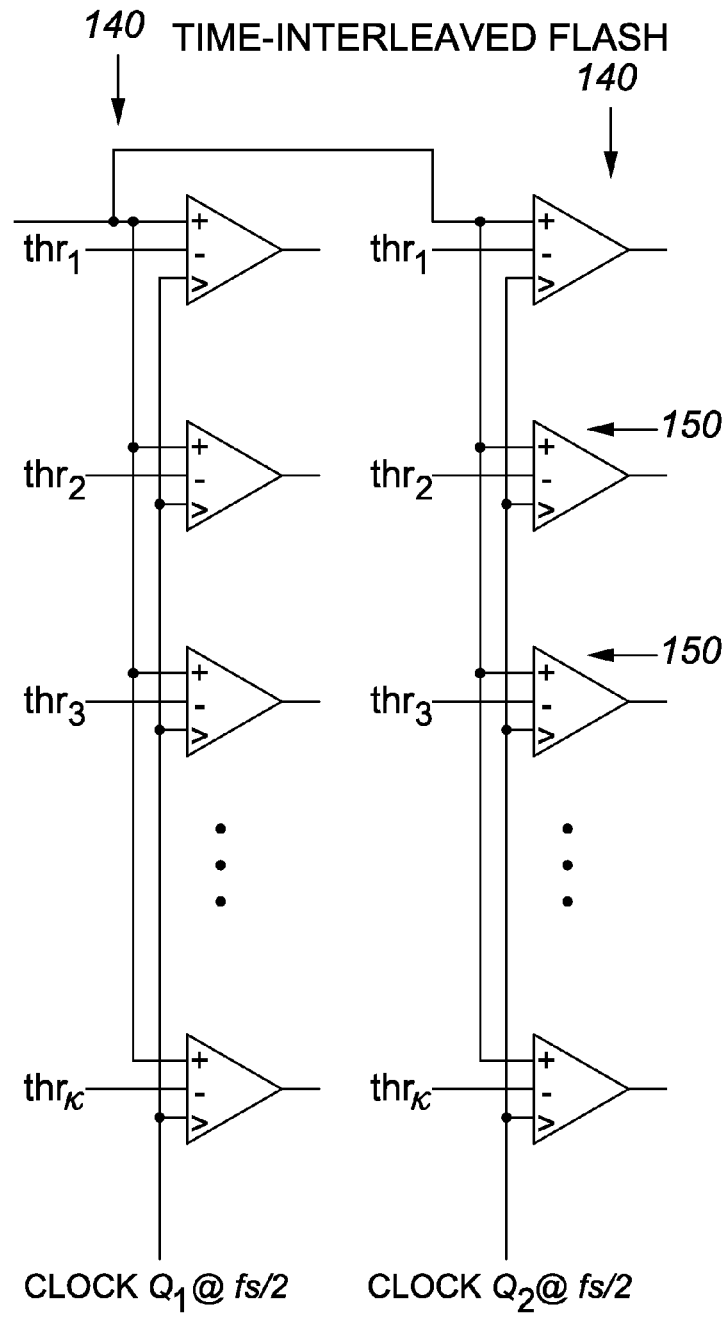

Very high speed flash ADCs often employ "time-interleaving" in which a total flash ADC is comprised of several time-interleaved sub-ADCs, as shown in FIG. 4B which illustrates a two-phase interleaved flash. For example, a 100 GSample/sec ADC can be implemented by time-interleaving 10 10 GSample/sec sub-ADCs. Each sub-ADC is clocked with a 10 GHz clock in this example, and the spacing between the 10 individual 10 GHz clocks is equal to the period of a single 100 GHz clock, thus the 10 sub-ADCs are time-interleaved with the resulting sampling rate of 100 GSamples/sec. In an example using time-interleaved sub-ADCs, as shown in FIG. 4B, each sub-ADC comprises a set of comparators running off a different phase of a lower speed clock. Time-interleaving allows samplers to run off of a slower clock while maintaining the higher speed net sampling frequency.

The embodiments described thus far can also be used in a time interleaved implementation. In such an example embodiment, for each comparator, obtain the comparator's reference O, store it and later compare all the A values, and adjust as required. Even in time interleaved implementation, comparator thresholds can be adjusted a manner as described in this example.

However, for time interleaved ADC, there is an advantage that can be used. In a time interleaved ADC, it is desirable to have all these thresholds not only to be linear, but also to be the same for each leaf in the time interleaving. The time interleaving can be transparent when the thresholds are identical.

In an example using time-interleaved sub-ADCs, as shown in FIG. 4B, the ADC comprises a plurality of sub-ADCs arranged in columns 140, the plurality of sub-ADCs each having comparators arranged in rows 150. The top comparators of the columns, in each of the leafs are called phases or leaves of the time interleave. If the effective threshold (the threshold that accounts for the offset) were to be identical for each one them, then one would not know or care that it is time interleaved. It is therefore desirable to have each threshold for each leaf, or each phase, of this time interleaving to be identical, or substantially identical within a tolerable margin of error.

In an example embodiment, the thresholds are substantially identical in the horizontal direction and linearly spaced in the vertical direction as shown in FIG. 4B. Such an example embodiment has linear spacing that is substantially identical in each leaf. Therefore, the comparators and their thresholds are linearly spaced vertically and they are equivalent and substantially identical horizontally, which means that they are also linearly spaced in each vertical direction for each column.

In an example embodiment the method further comprises, as illustrated in FIG. 1, assigning a common reference statistic as a common comparator threshold for each of the comparators in the same row in the plurality of sub-ADCs (116). In an example embodiment, the method further comprises: computing an average reference statistic for each of the comparators in the same row in the plurality of sub-ADCs; and assigning the average reference statistic as the common reference statistic.

With respect to gain and offset matching of the sub-ADCs in a time-interleaved flash ADC, this is accounted for in an embodiment of the present disclosure by establishing reference statistics as the average of the reference statistics of each sub-ADC, so the method equations are adjusted as follows.

$$A_{k,s} = \begin{matrix} 0, \text{ input} < thr_k \\ 1, \text{ input} > thr_k \end{matrix} \qquad \text{Equation 11}$$

where $A_{k,s}$ is the output of the kth comparator of the sth sub-ADC. Furthermore, in this embodiment, the reference statistics are defined as:

$$O_k = \frac{\sum_s \sum_N A_{k,s}}{S} \qquad \text{Equation 12}$$

where S is the number of sub-ADCs, and s is the sth sub-ADC.

In this example embodiment, all the individual samplers of each sub-ADC are forced by the method to be equal to a single set of reference statistics, which make the gain and offset of each sub-ADC tend to be equal, in addition to keeping the samplers spaced properly.

This embodiment for time-interleaved ADCs can be described as taking the average "O" across the "horizontal" as the reference for each comparator at that "position" or "level", and doing this for every comparator position in each "leaf". This provides the ability to perform time interleaving without affecting any of the comparators.

In another embodiment, the average is not taken, but one of the values is chosen. In an example embodiment, a common value is assigned for each horizontal position, which may or may not be the average. Embodiments implementing an average can be useful, since it is statistical, since averaging is similar to spending more time observing the values.

According to this example embodiment for a time-interleaved ADC, the same reference is provided for each horizontal position in a bank in a column. Such an example embodiment enables time interleaving to become an implementation detail that does not need to be no one should care about.

Though the assigning of a common value introduces a small disturbance with respect to the originally computed reference statistic, such a disturbance is acceptable in situations where it is advantageous to reduce or remove from consideration constraints related to the time-interleaved implementation.

Embodiments of the present disclosure use statistics from foreground calibration as a reference for performing background calibration of comparators in an ADC.

Embodiments are disclosed herein that reduce sampler offsets in the background and also reduce gain and offset differences among sub-ADCs of a time-interleaved flash ADC.

Embodiments of the present disclosure enable background calibration in lower power ADCs and/or higher performance ADCs. The ADC is a fundamental object of signal processing in many electronic products. Embodiments of the present disclosure provide a competitive advantage in power or performance.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method of background calibration of threshold errors in an analog to digital converter (ADC) having a plurality of comparators comprising:

for each of the plurality of comparators:
measuring an output ($A_k$) of the comparator during normal input signal flow;
comparing the comparator output to a corresponding reference statistic ($O_k$), the corresponding reference statistic being based on comparator outputs observed during a known state of calibration; and
adjusting a comparator threshold until the output ($A_k$) is sufficiently equal to the corresponding reference statistic ($O_k$).

2. The method of claim 1 wherein the corresponding reference statistic is based on comparator outputs observed when the ADC is in a normal operation state, but just after the ADC has been calibrated.

3. The method of claim 1 wherein the corresponding reference statistic is based on comparator outputs observed during power-up.

4. The method of claim 1 wherein the corresponding reference statistic is based on comparator outputs observed just after foreground calibration.

5. The method of claim 1 further comprising:
computing the corresponding reference statistic shortly after the known state of calibration based on the comparator outputs gathered during the known state of calibration.

6. The method of claim 1 further comprising:
gathering comparator outputs during the known state of calibration.

7. The method of claim 1 further comprising, prior to the comparing:
calibrating a comparator threshold in the foreground using an on-chip calibration signal.

8. The method of claim 1 wherein the measuring, the comparing and the adjusting are performed such that input and output signal flow to and from the ADC are undisturbed.

9. The method of claim 1 wherein:

$$A_k = \begin{matrix} 0, \text{ input} < thr_k \\ 1, \text{ input} > thr_k, \end{matrix}$$

where $thr_k$ is the comparator threshold;

$$O_k = \sum_N A_k,$$

where N is the number of samples of the comparator output and k is a comparator index; and
the comparator threshold is adjusted according to:

$$\text{If } |A_k - O_k| > \delta \xrightarrow{then} \text{threshold}_k[i+1] = \text{threshold}_k[i] - \mu \cdot \text{sign}(A_k - O_k).$$

10. The method of claim 1 wherein the ADC comprises a plurality of sub-ADCs arranged logically in columns, the plurality of sub-ADCs each having comparators arranged logically in rows, and wherein the method further comprises:
assigning a common reference statistic as a common comparator threshold for each of the comparators in the same row in the plurality of sub-ADCs.

11. The method of claim 10 further comprising:
computing an average reference statistic for each of the comparators in the same row in the plurality of sub-ADCs; and
assigning the average reference statistic as the common reference statistic.

12. The method of claim 10 wherein:

$$A_{k,s} = \begin{matrix} 0, \text{ input} < thr_k \\ 1, \text{ input} > thr_k, \end{matrix}$$

where $A_{k,s}$ is the output of a comparator with index k of sub-ADC s, and $thr_k$ is the comparator threshold;

$$O_k = \frac{\sum_s \sum_N A_{k,s}}{S},$$

where S is the number of sub-ADCs, and N is the number of samples of the comparator output and k is a comparator index; and the comparator threshold is adjusted according to:

If $|A_k - O_k| > \delta \xrightarrow{then}$ threshold$_k[i+1]$ = threshold$_k[i] - \mu \cdot \text{sign}(A_k - O_k)$.

13. A method of background calibration of threshold errors in a data communication system, comprising:
   computing a reference statistic for a comparator in an analog to digital converter (ADC) based on comparator output values observed during foreground calibration; and
   calibrating the comparator threshold using a background calibration control loop method to remove comparator offsets based on the computed reference statistic.

14. The method of claim 13 further comprising:
   measuring an output ($A_k$) of the comparator during normal input signal flow;
   comparing the comparator output to the computed reference statistic ($O_k$); and
   adjusting the comparator threshold until the output ($A_k$) is sufficiently equal to the corresponding reference statistic ($O_k$).

15. The method of claim 13 wherein computing the reference statistic is performed shortly after a transition from foreground calibration to background calibration.

16. The method of claim 13 wherein:

$$A_k = \begin{matrix} 0, \text{input} < thr_k \\ 1, \text{input} > thr_k, \end{matrix}$$

where $thr_k$ is the comparator threshold;

$$O_k = \sum_N A_k,$$

where N is the number of samples of the comparator output and k is a comparator index; and the comparator threshold is adjusted according to:

If $|A_k - O_k| > \delta \xrightarrow{then}$
threshold$_k[i+1]$ = threshold$_k[i] - \mu \cdot \text{sign}(A_k - O_k)$.

17. The method of claim 13 wherein the ADC comprises a plurality of sub-ADCs arranged in columns, the plurality of sub-ADCs each having comparators arranged in rows, and wherein the method further comprises:
   assigning a common reference statistic as a common comparator threshold for each of the comparators in the same row in the plurality of sub-ADCs.

18. The method of claim 17 further comprising:
   computing an average reference statistic for each of the comparators in the same row in the plurality of sub-ADCs; and
   assigning the average reference statistic as the common reference statistic.

19. The method of claim 17 wherein:

$$A_{k,s} = \begin{matrix} 0, \text{input} < thr_k \\ 1, \text{input} > thr_k, \end{matrix}$$

where $A_{k,s}$ is the output of a comparator with index k of sub-ADC s, and $thr_k$ is the comparator threshold;

$$O_k = \frac{\sum_s \sum_N A_{k,s}}{S},$$

where S is the number of sub-ADCs, and N is the number of samples of the comparator output and k is a comparator index; and the comparator threshold is adjusted according to:

If $|A_k - O_k| > \delta \xrightarrow{then}$
threshold$_k[i+1]$ = threshold$_k[i] - \mu \cdot \text{sign}(A_k - O_k)$.

20. A computer-readable memory device storing statements and instructions for execution by a processor to perform a method of background calibration of threshold errors in an analog to digital converter (ADC) having a plurality of comparators, comprising:
   for each of the plurality of comparators:
      measuring an output ($A_k$) of the comparator during normal input signal flow;
      comparing the comparator output to a corresponding reference statistic ($O_k$), the corresponding reference statistic being based on comparator outputs observed during a known state of calibration; and
      adjusting a comparator threshold until the output ($A_k$) is sufficiently equal to the corresponding reference statistic ($O_k$).

21. The computer-readable memory device of claim 20 wherein the corresponding reference statistic is based on comparator outputs observed when the ADC is outside of a normal operation state.

22. The computer-readable memory device of claim 20 wherein the corresponding reference statistic is based on comparator outputs observed during power-up.

23. The computer-readable memory device of claim 20 wherein the corresponding reference statistic is based on comparator outputs observed during foreground calibration.

24. The computer-readable memory device of claim 20 wherein the method further comprises:
   computing the corresponding reference statistic shortly after the known state of calibration based on the comparator outputs gathered during the known state of calibration.

25. The computer-readable memory device of claim 20 wherein the method further comprises:
   gathering comparator outputs during the known state of calibration.

26. The computer-readable memory device of claim 20 wherein the method further comprises, prior to the comparing:

calibrating a comparator threshold in the foreground using an on-chip calibration signal.

27. The computer-readable memory device of claim 20 wherein the measuring, the comparing and the adjusting are performed such that input and output signal flow to and from the ADC are undisturbed.

28. The computer-readable memory device of claim 20 wherein:

$$A_k = \begin{cases} 0, & \text{input} < thr_k \\ 1, & \text{input} > thr_k \end{cases},$$

where $thr_k$ is the comparator threshold;

$$O_k = \sum_N A_k,$$

where N is the number of samples of the comparator output and k is a comparator index; and
the comparator threshold is adjusted according to:

$$\text{If } |A_k - O_k| > \delta \xrightarrow{then}$$
$$\text{threshold}_k[i+1] = \text{threshold}_k[i] - \mu \cdot \text{sign}(A_k - O_k).$$

29. The computer-readable memory device of claim 20 wherein the ADC comprises a plurality of sub-ADCs arranged in columns, the plurality of sub-ADCs each having comparators arranged in rows, and wherein the method further comprises:
assigning a common reference statistic as a common comparator threshold for each of the comparators in the same row in the plurality of sub-ADCs.

30. The computer-readable memory device of claim 29 wherein the method further comprises:
computing an average reference statistic for each of the comparators in the same row in the plurality of sub-ADCs; and
assigning the average reference statistic as the common reference statistic.

31. The computer-readable memory device of claim 29 wherein:

$$A_k = \begin{cases} 0, & \text{input} < thr_k \\ 1, & \text{input} > thr_k \end{cases},$$

where $A_{k,s}$ is the output of a comparator with index k of sub-ADC s, and $thr_k$ is the comparator threshold;

$$O_k = \frac{\sum_s \sum_N A_{k,s}}{S},$$

where S is the number of sub-ADCs, s is the sth sub-ADC, and N is the number of samples of the comparator output and k is a comparator index; and
the comparator threshold is adjusted according to:

$$\text{If } |A_k - O_k| > \delta \xrightarrow{then}$$
$$\text{threshold}_k[i+1] = \text{threshold}_k[i] - \mu \cdot \text{sign}(A_k - O_k).$$

\* \* \* \* \*